United States Patent
Rahman et al.

(10) Patent No.: US 7,518,398 B1
(45) Date of Patent: Apr. 14, 2009

(54) INTEGRATED CIRCUIT WITH THROUGH-DIE VIA INTERFACE FOR DIE STACKING

(75) Inventors: Arifur Rahman, San Jose, CA (US); Stephen M. Trimberger, San Jose, CA (US); Bernard J. New, Carmel Valley, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/973,062

(22) Filed: Oct. 4, 2007

(51) Int. Cl.
*H03K 19/173* (2006.01)

(52) U.S. Cl. .......................... 326/38; 326/41

(58) Field of Classification Search .............. 326/38–41
See application file for complete search history.

(56) References Cited

U.S. PATENT DOCUMENTS

| | | | |
|---|---|---|---|
| 6,337,579 B1* | 1/2002 | Mochida | 326/41 |
| 6,781,226 B2* | 8/2004 | Huppenthal et al. | 257/686 |
| 6,875,921 B1 | 4/2005 | Cobb | |
| 6,917,219 B2* | 7/2005 | New | 326/41 |
| 7,098,542 B1* | 8/2006 | Hoang et al. | 257/778 |
| 7,233,061 B1 | 6/2007 | Cobb | |
| 2004/0262635 A1* | 12/2004 | Lee | 257/199 |
| 2007/0152708 A1* | 7/2007 | Madurawe et al. | 326/39 |
| 2008/0042140 A1* | 2/2008 | Alam et al. | 257/74 |

OTHER PUBLICATIONS

U.S. Appl. No. 11/973,245, filed Oct. 4, 2007, Rahman et al.
U.S. Appl. No. 12/128,459, filed May 28, 2008, Trimberger et al.
Rahman, Arifur et al., "Die Stacking Technology for Terabit Chip-to-Chip Communications," pp. 1-4, available from Xilinx, Inc., 2100 Logic Drive, San Jose, CA 95124, www.xilinx.com.
Baliga, John et al., "Through-Silicon Technology, Applications Growing", Semiconductor International, Mar. 1, 2005, pp. 1-3, available from Semiconductor International, 2000 Clearwater Drive, Oak Brook, IL 60523 or http://www.semiconductor.net.
Garrou, Phillip, "Future ICs Go Vertical", MCNC Research & Development Institute, Feb. 1, 2005, pp. 1-10, available from Semiconductor International, 2000 Clearwater Drive, Oak Brook, IL 60523 or http://www.semiconductor.net.
Guarini, K. W. et al., "Electrical Integrity of State-of-the-Art 0.13 um SOI CMOS Devices and Circuits Transferred for Three-Dimensional (3D) Integrated Circuit (IC) Fabrication", 2002, pp. 943-945, available from IEEE, 3 Park Avenue, 17th Floor, New York, NY 10016-5997.

(Continued)

*Primary Examiner*—Don P Le
(74) *Attorney, Agent, or Firm*—Robert M. Brush

(57) ABSTRACT

An integrated circuit with a through-die via (TDV) interface for die stacking is described. One aspect of the invention relates to an integrated circuit die having an array of tiles arranged in columns. The integrated circuit die includes at least one interface tile. Each interface tile includes a logic element, contacts, and through die vias (TDVs). The logic element is coupled to a routing fabric of the integrated circuit die. The contacts are configured to be coupled to conductive interconnect of another integrated circuit die attached to the backside of the integrated circuit die. The TDVs are configured to couple the logic element to the contacts.

18 Claims, 6 Drawing Sheets

OTHER PUBLICATIONS

Ieong, Meikei et al., "Three Dimensional CMOS Devices and Integrated Circuits", 2003, IEEE 2003 Custom Integrated Circuits Conference, pp. 207-213 available from IEEE, 3 Park Avenue, 17th Floor, New York, NY 10016-5997.

U.S. Appl. No. 11/701,807, filed Feb. 1, 2007, Rahman, Arifur et al., "Method and Apparatus for Integrating Capacitors In Stacked Integrated Circuits", 31 pages, available from Xilinx, Inc., 2100 Logic Drive, San Jose, CA 95124.

* cited by examiner

INTEGRATED CIRCUIT WITH THROUGH-DIE VIA INTERFACE FOR DIE STACKING

FIELD OF THE INVENTION

One or more aspects of the present invention relate generally to semiconductor devices and, more particularly, to an integrated circuit with a through-die via (TDV) interface for die stacking.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes configurable logic blocks (CLBs), programmable input/output blocks (IOBs), and other types of logic blocks, such as memories, microprocessors, digital signal processors (DSPs), and the like. The CLBs, IOBs, and other logic blocks are interconnected by a programmable interconnect structure. The CLBs, IOBs, logic blocks, and interconnect structure are typically programmed by loading a stream of configuration data (known as a bitstream) into internal configuration memory cells that define how the CLBs, IOBs, logic blocks, and interconnect structure are configured. An FPGA may also include various dedicated logic circuits, such as digital clock managers (DCMs), input/output (I/O) transceivers, boundary scan logic, and the like.

As semiconductor technology has advanced, the amount and speed of logic available on an IC, such as an FPGA, has increased more rapidly than the number and performance of I/O connections. As a result, IC die stacking techniques have received renewed interest to address the interconnection bottleneck of high-performance systems. In stacked IC applications, two or more ICs are stacked vertically and interconnections are made between them.

One approach to stacking a die on an FPGA involves mounting a second die on the face side of the FPGA die. The term "face side" denotes the side of a FPGA die that receives the bulk of semiconductor processing such that circuitry and interconnect are fabricated on that face side. The FPGA includes interface circuitry coupled to an array of contacts on the face side of the FPGA die. A second die is mounted on the face side of the FPGA die such that signals from the second die are communicated through the contacts to the interface circuitry of the FPGA. This approach, however, is incompatible with FPGAs designed for flip-chip packaging. In a flip-chip package, the bump contacts for power, ground, and signals are distributed throughout the face side of the FPGA die. Such bump contacts make it difficult if not impossible to mount a second IC to the face side of the FPGA die. Accordingly, there exists a need in the art for a die stacking approach that is compatible with flip-chip integrated circuit packaging techniques.

SUMMARY OF THE INVENTION

An integrated circuit with a through-die via (TDV) interface for die stacking is described. One aspect of the invention relates to an integrated circuit die having an array of tiles arranged in columns. The integrated circuit die includes at least one interface tile. Each interface tile includes a logic element, contacts, and through die vias (TDVs). The logic element is coupled to a routing fabric of the integrated circuit die. The contacts are configured to be coupled to conductive interconnect of another integrated circuit die attached to the backside of the integrated circuit die. The TDVs are configured to couple the logic element to the contacts.

Another aspect of the invention relates to a semiconductor device having a first integrated circuit die and a second integrated circuit die attached to the backside of the first integrated circuit die. The first integrated circuit die includes an array of tiles arranged in columns, which provides a routing fabric. The tiles include at least one interface tile, each of which includes a logic element, contacts, and TDVs. The logic element is coupled to the routing fabric. The contacts are formed on the backside of the first integrated circuit die and coupled to conductive interconnect of the second integrated circuit die. The TDVs are configured to couple the logic element to the contacts.

Another aspect of the invention relates to a semiconductor device that includes a first integrated circuit die and a second integrated circuit die. The first integrated circuit die includes first circuitry, first boundary scan logic, and a first test access port. The first test access port is coupled to the first boundary scan logic. The second integrated circuit die is attached to the backside of the first integrated circuit die and includes second circuitry, second boundary scan logic, and a second test access port. The second test access port is coupled to the second boundary scan logic. Through-die vias (TDVs) are formed on the first integrated circuit die electrically coupled to the second test access port. A programmable switch is formed on the first integrated circuit die. The programmable switch is configured to selectively provide an input test signal to either the first test access port or first ones of the TDVs and receive an output test signal from either the first test access port or a second one of the TDVs.

Another aspect of the invention relates to a semiconductor device that includes a first integrated circuit die and a second integrated circuit die. The first integrated circuit die includes first circuitry, first boundary scan logic, and a first test access port. The first test access port is coupled to the first boundary scan logic. The second integrated circuit die is attached to the backside of the first integrated circuit die and includes second circuitry, second boundary scan logic, and a second test access port. The second test access port is coupled to the second boundary scan logic. TDVs are formed on the first integrated circuit die electrically coupled to the second test access port. The TDVs are configured to provide an input test signal from the first circuitry to the second test access port and receive an output test signal from the second test access port to the first circuitry.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Figure 1:
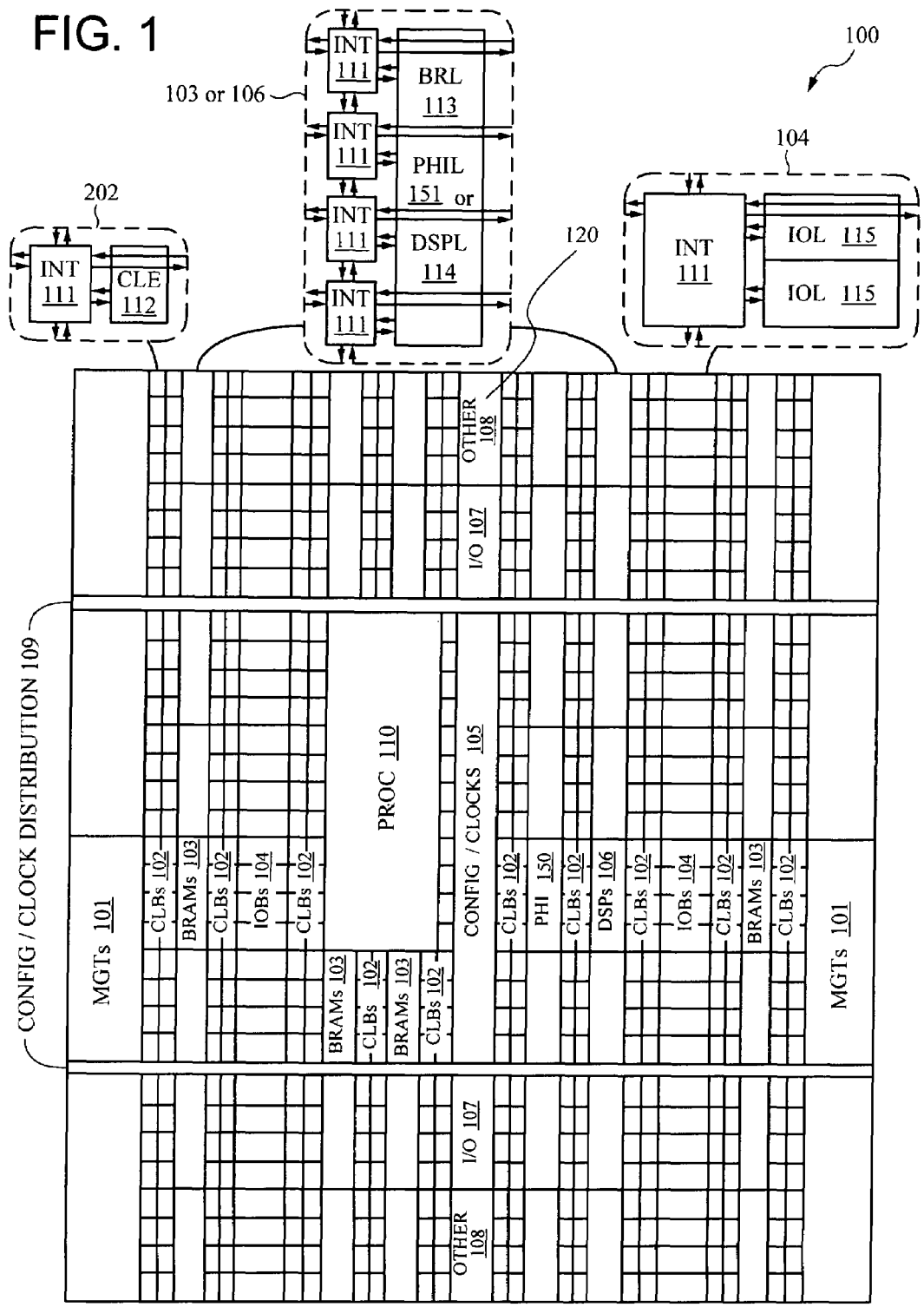
FIG. 1 is a block diagram depicting an exemplary embodiment of an FPGA in accordance with one or more aspects of the invention.

FIG. 1 is a block diagram depicting an exemplary embodiment of an FPGA 100 in accordance with one or more aspects of the invention. The FPGA 100 includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110). The FPGA 100 also includes one or more programmable heterogeneous integration (PHI) tiles 150. In some embodiments, the FPGA 100 includes a plurality of PHI tiles 150 arranged in a column. The PHI tiles 150 facilitate interconnection to one or more other ICs stacked on the backside of the die of the FPGA 100. The PHI tiles 150 are discussed in detail below.

In some FPGAs, each programmable tile includes a programmable interconnect element (INT 111) having standardized connections via routing conductor segments to and from a corresponding interconnect element in each adjacent tile. Therefore, the programmable interconnect elements and routing conductor segments taken together implement the programmable interconnect structure for the illustrated FPGA. The programmable interconnect element (INT 111) also includes the connections to and from the programmable logic element within the same tile, as shown by the examples included at the top of FIG. 1. The programmable interconnect element (INT 111) may also include connections via routing conductor segments to and from a corresponding interconnect element that span multiple columns of logic. That is, routing conductor segments may span a plurality of tiles (e.g., a "hex" line spans six tiles).

For example, a CLB 102 can include a configurable logic element (CLE 112) that can be programmed to implement user logic plus a single programmable interconnect element (INT 111). The CLE 112 includes one or more slices of logic (not shown). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements (e.g., four are shown). A PHI tile 150 includes a PHI logic element (PHIL 151) in addition to an appropriate number of programmable interconnect elements (e.g., four are shown). An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (120 in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA, more than one adjacent column of CLBs is typically included wherever the CLBs appear, to facilitate the efficient implementation of user logic. Examples of FPGAs that may be used with embodiments of the invention are the Virtex 5 FPGAs available from Xilinx, Inc., of San Jose, Calif.

Figure 2:
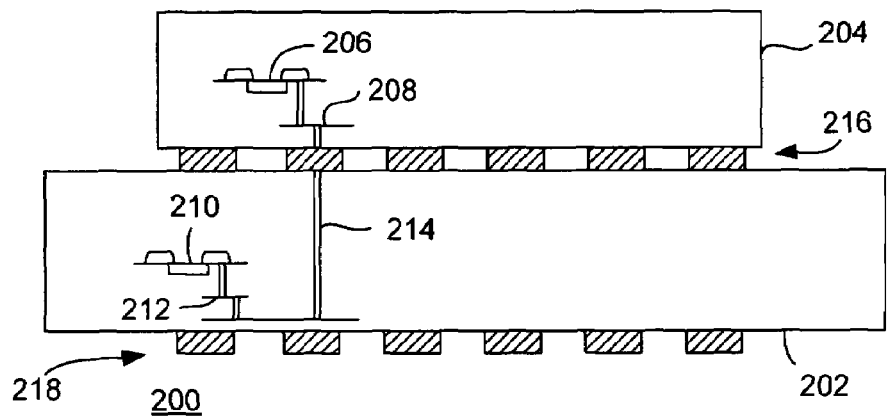
FIG. 2 is a cross-sectional view showing an exemplary embodiment of a semiconductor device in accordance with one or more aspects of the invention.

FIG. 2 is a cross-sectional view showing an exemplary embodiment of a semiconductor device 200 in accordance with one or more aspects of the invention. The semiconductor device 200 includes an FPGA die 202 and a second die 204. The FPGA die 202 may be configured in accordance with the FPGA architecture 100 shown in FIG. 1. The second die 204 may comprise any type of digital, analog, or mixed-signal IC. The second die 204 is vertically stacked with the FPGA die 202. Each of the die 202 and 204 is configured for face-down mounting in flip-chip fashion. As discussed above, the term "face side" denotes the side of a die that receives the bulk of semiconductor processing such that circuitry is fabricated on that face side of the die. The side of a die opposite the face side is referred to as the backside of the die. Thus, the face side of the second die 204 is mounted to the backside of the FPGA die 202.

In particular, the second die 204 includes circuitry formed on a semiconductor substrate. A portion of the circuitry is symbolically shown by a transistor 206. The second die 204 also includes conductive interconnect formed over the circuitry. A portion 208 of the conductive interconnect is symbolically shown by signal vias coupled to a metal layer.

The FPGA die 202 includes circuitry formed on a semiconductor substrate and conductive interconnect formed over the circuitry. The FPGA die 202 also includes an array of bump contacts 218 formed on the face side for flip-chip mounting to a carrier. A portion of the circuitry is symbolically shown by a transistor 210. A portion 212 of the conductive interconnect is symbolically shown by signal vias coupled to metal layers. The FPGA die 202 also includes a through-die via (TDV) 214 and an array of contacts 216. The contacts 216 are formed on the backside of the FPGA die 202. The TDV 214 electrically couples the portion 212 of the conductive interconnect to the contacts 216. The TDV 214 extends from the backside of the FPGA die 202 towards the face side of the FPGA die 202 to couple with the conductive interconnect. The width of the TDV 214 depends on the thickness of the semiconductor substrate of the FPGA die 202. For example, for substrates ranging from 10 µm to 100 µm, the width of TDV 214 may range between 2 µm and 15 µm. Fabrication of the TDV 214 is known in the art. (See, for example U.S. Pat. Nos. 6,875,921 "Capacitive Interposer" and 7,233,061 "Interposer for impedance matching").

The second die 204 is electrically and mechanically coupled to the contacts 216. The contacts 216 couple circuitry of the second die 204 to the TDV 214. In this manner, circuitry on the second die 204 is configured for communication with circuitry on the FPGA die 202. Those skilled in the art will appreciate that the FPGA die 202 may include a plurality of TDVs for coupling electrical signals between circuits on the FPGA die 202 and circuits on the second die 204. Notably, as discussed further below, a PHI tile 150 includes TDVs for providing an interface between FPGA logic and one or more stacked ICs.

Returning to FIG. 1, the FPGA architecture 100 includes multiple columns of logic, including CLB columns, DSP columns, BRAM columns, IOB columns, and the like. In the embodiment shown, the FPGA architecture 100 also includes a column of PHI tiles 150. Although only a single column of PHI tiles 150 is shown, it is to be understood that the FPGA architecture 100 may generally include one or more columns of PHI tiles 150. The PHI tile 150 generally includes circuitry and TDVs for providing an interface between the FPGA and one or more additional ICs mounted to the backside of the FPGA.

Figure 3:
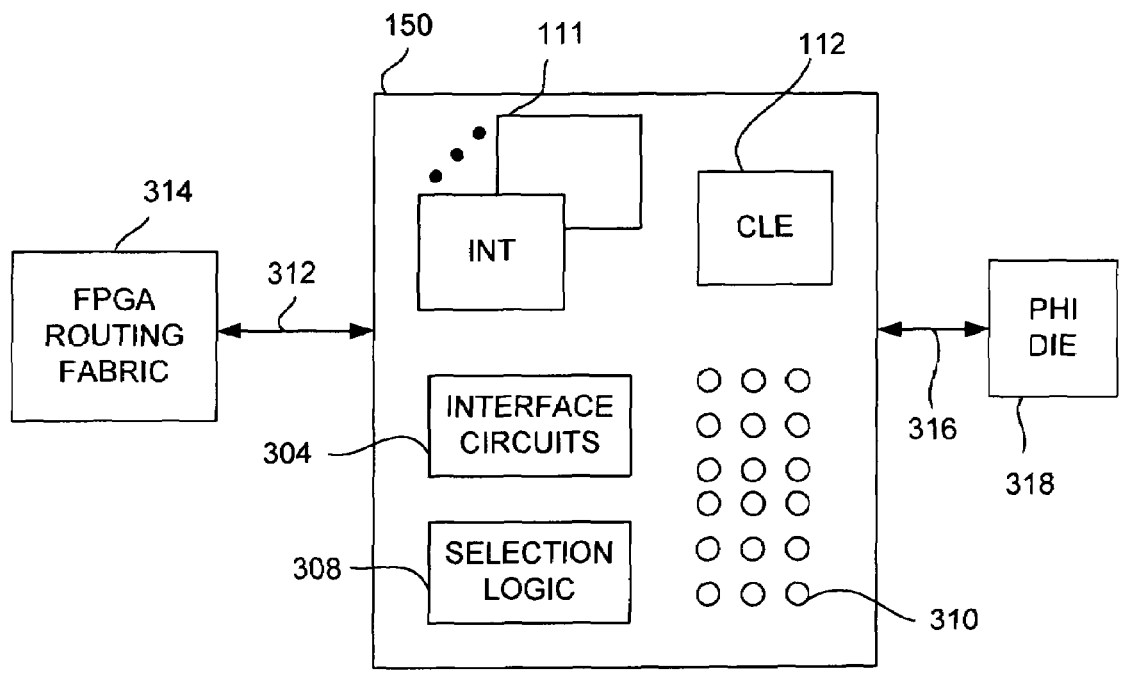
FIG. 3 is a block diagram depicting an exemplary embodiment of an interface tile in accordance with one or more aspects of the invention.

FIG. 3 is a block diagram depicting an exemplary embodiment of a PHI tile 150 in accordance with one or more aspects of the invention. The PHI tile 150 includes one or more programmable interconnect elements 111, a configurable logic element 112, interface circuits 304, selection logic 308, and a plurality of TDVs 310. The PHI tile 300 includes an interface 312 to routing fabric 314 of the FPGA, and an interface 316 with a second IC die (referred to as "PHI die 318"). The interface 316 includes a plurality of contacts formed on the backside of the FPGA die (e.g., contacts 216 shown in FIG. 2). The contacts of the interface 316 are electrically coupled to conductive interconnect of the PHI die 318 (e.g., interconnect 208 shown in FIG. 2). The interface 312 includes various routing conductor segments that form part of the FPGA routing fabric 314.

Each of the programmable interconnect elements 111 includes programmable multiplexing structures that couple the PHI tile 150 to the routing conductor segments of the interface 312. The configurable logic element 112 includes one or more slices of logic having lookup tables (LUTs), multiplexers, flip-flops, and the like, as described above with respect to the CLBs.

The interface circuits 304 facilitate communication between the FPGA routing fabric 314 and the PHI die 316 through the TDVs 310. The selection logic 308 is configured to selectively change the function of the PHI tile 150 between a programmable logic tile (e.g., a CLB) and an interface tile. For example, the selection logic 308 may be configured such that signals received from the FPGA routing fabric 314 are coupled to the CLE 112, and signals produced by the CLE 112 are coupled to the FPGA routing fabric 314. In other words, the selection logic 308 causes the PHI tile 150 to operate similar to a CLB tile (e.g., CLB 102). Alternatively, the selection logic 308 may be configured such that signals received from the FPGA routing fabric 314 are coupled to the PHI die 318 through the interface circuits 304 and the TDVs 310, and signals produced by the PHI die 150 are coupled to the FPGA routing fabric 314 through the interface circuits 304 and the TDVs 310. In other words, the selection logic 308 cause the PHI tile 150 to operate as an interface tile between the FPGA routing fabric 314 and the PHI die 318. The function of the PHI tile 150 as implemented by the selection logic 308 may be controlled by the configuration memory cells of the FPGA (not shown) or by a control signal either external to or internal to the PHI tile 150.

In some embodiments, the interface circuits 304 provide voltage level translation. In some cases, the PHI tile 150 and the FPGA may operate using a different supply voltage than the PHI die 318. The voltage of signals originating from the FPGA routing fabric 314 and destined for the PHI die 318 is translated to the voltage required by the PHI die 318. Likewise, the voltage of signals originating from the PHI die 318 and destined for the FPGA routing fabric 314 is translated to the voltage required by the FPGA. In some embodiments, the interface circuits 304 also provide for registering of signals coupled from the FPGA routing fabric 314 to the PHI die 318, and signals coupled from the PHI die 318 to the FPGA routing fabric 314.

The TDVs 310 are electrically coupled to contacts on the backside of the FPGA die (e.g., contacts 216 in FIG. 2). The TDVs 310 are further electrically coupled to integrated circuitry forming the logic of the PHI tile 150 through the conductive interconnect of the FPGA die. As described above, the TDVs 310 enable communication of signals between the PHI tile 150 and the PHI die 318.

Figure 4:
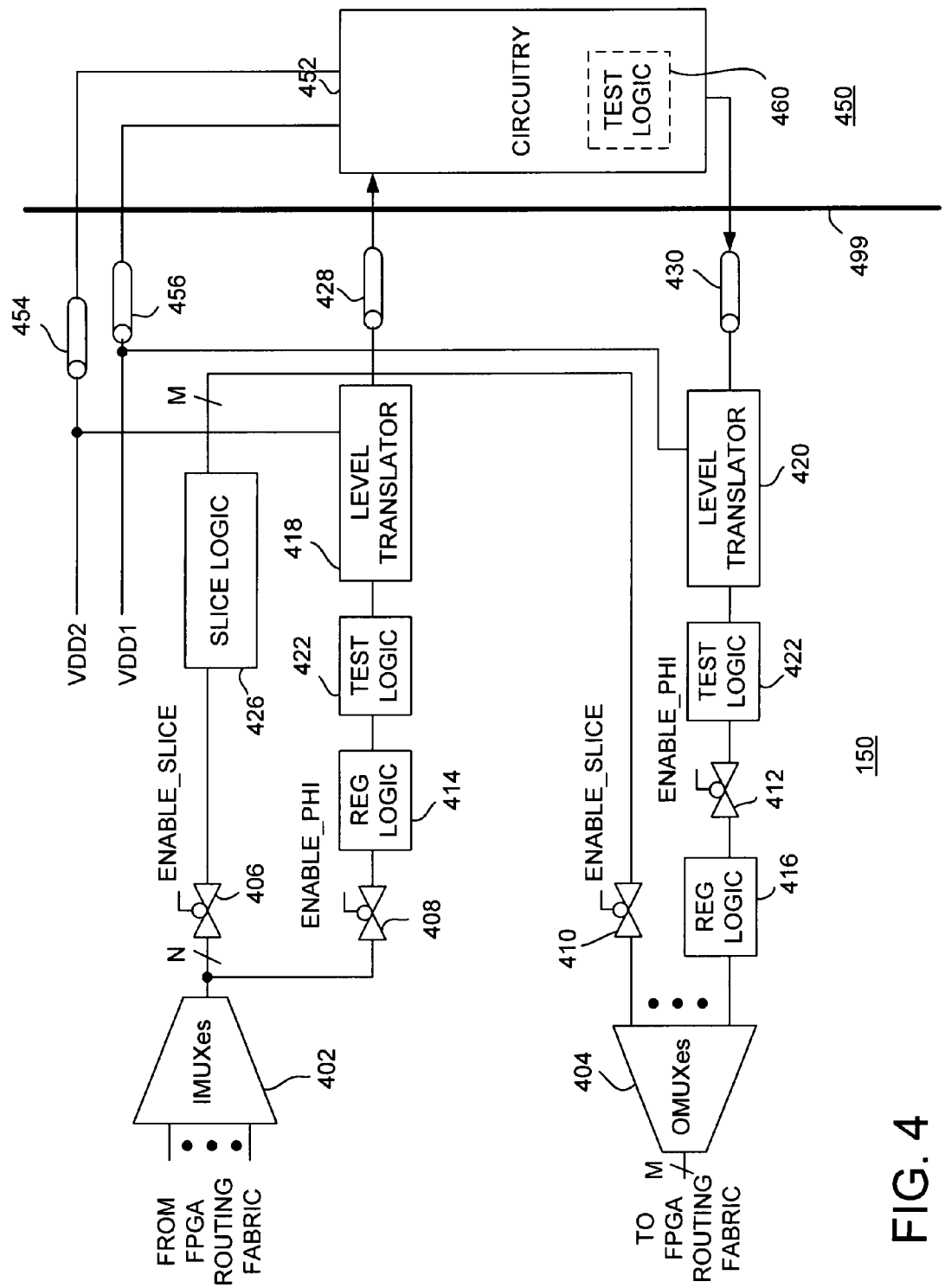
FIG. 4 is a block diagram depicting a more detailed exemplary embodiment of an interface tile in accordance with one or more aspects of the invention.

FIG. 4 is a block diagram depicting a more detailed exemplary embodiment of a PHI tile 150 in accordance with one or more aspects of the invention. In the present embodiment, the PHI tile 150 includes input multiplexing logic (IMUXes 402), output multiplexing logic (OMUXes 404), three-state buffers 406, 408, 410, and 412, register logic 414 and 416, level-translation circuits 418 and 420, test circuitry 422, slice logic 426, and TDVs 428 and 430. With respect to FIG. 3, the three-state buffers 406 through 412 comprise the selection logic 308. The register logic 414, level-translation circuit 418, and test circuitry 422 comprise a first interface circuit. The register logic 416, level-translation circuit 420, and test circuitry 422 comprise a second interface circuit. The IMUXes 402 and OMUXes 404 comprise the programmable interconnect elements. The slice logic 426 comprises the configurable logic element.

Inputs of the IMUXes 402 are coupled to the FPGA routing fabric. An output of the IMUXes 402 is coupled to inputs of the three-state buffers 406 and 408, respectively. The output of the IMUXes 402 illustratively includes N terminals, where N is an integer greater than zero (i.e., the IMUXes 402 include N multiplexers). The IMUXes 402 are configured to couple selected routing conductors of the FPGA routing fabric to the three-state buffers 406 and 408.

An output of the three-state buffer 406 is coupled to an input of the slice logic 426. The slice logic 426 includes a plurality of slices. Each of the slices includes various logic elements, including LUTs, flip-flops, combinatorial logic, and the like. An output of the three-state buffer 408 is coupled to an input of the register logic 414. The register logic 414 includes a plurality of registers (e.g., flip-flops). For example, the register logic 414 may include N flip-flops, one for each terminal of the output of the IMUXes 402.

A control input of the three-state buffer 406 is configured to receive an enable_slice signal. A control input of the three-state buffer 408 is configured to receive an enable_PHI signal. The enable_slice and enable_PHI signals may be generated externally to the PHI tile 150 or may be set by configuration memory cells. If the enable_slice signal is active, the outputs of the IMUXes 402 are coupled to the slice logic 426. If the enable_slice signal is inactive, the three-state buffer 406 provides a high-impedance output for the slice logic 426. Likewise, if the enable_PHI signal is active, the outputs of the IMUXes 402 are coupled to the register logic 414. If the enable_PHI signal is inactive, the three-state buffer 408 provides a high-impedance output for the register logic 414. In this manner, the enable_slice and enable_PHI signals control whether the IMUXes 402 drive the slice logic 426 and/or the register logic 414. In one embodiment, the three-state buffers 406 and 408 are configured such that the IMUXes 402 drive either the slice logic 426 or the register logic 414.

An output of the slice logic 426 is coupled to an input of the three-state buffer 410. The output of the slice logic 426 is illustratively shown as having M terminals, where M is an integer greater than zero. An output of the three-state buffer 410 is coupled to inputs of the OMUXes 404. The OMUXes 404 include M multiplexers. An output of the three-state buffer 412 is coupled to an input of the register logic 416. An output of the register logic 416 is coupled to the inputs of the OMUXes 404. The register logic 416 includes a plurality of registers (e.g., flip-flops). For example, the register logic 416 may include M flip-flops. A control input of the three-state buffer 410 is configured to receive the enable_slice signal. A control input of the three-state buffer 412 is configured to receive the enable_PHI signal. The three-state buffers 410 and 412 operate in a manner similar to the three-state buffers 406 and 408. An output of the OMUXes 404 is coupled to the FPGA routing fabric.

Using the three-state buffers 406-412, the PHI tile 150 may function as a CLB or as an interface tile for interfacing the PHI die 450. The three-state buffers 406 and 410 may be active, causing input signals to pass from the IMUXes 402 through the slice logic 426, and output signals to pass from the slice logic 426 to the OMUXes 404. Alternatively, the three-state buffers 408 and 412 may be active, causing input signals to pass from the IMUXes 402 through the register logic 414, level-translation circuit 418, test circuitry 422, and TDVs 428 to the circuitry 452 on the PHI die 450, and output signals to pass through the TDVs 430, test circuitry 422, level-translation circuit 420, and register logic 416 to the OMUXes 404.

An output of the register logic 414 is coupled to an input of the level-translation circuit 418 through the test circuitry 422. An output of the level translation circuit 418 is coupled to the TDVs 428. The TDVs 428 are electrically coupled circuitry 452 in a PHI die 450. The PHI die 450 is electrically and mechanically coupled to the backside of the die of the FPGA having the PHI tile 150. The circuitry 452 is illustratively configured to receive a pair of voltage supplies, denoted as VDD1 and VDD2. The voltage supplies VDD1 and VDD2 are provided to the PHI die 450 through TDVs 454 and 456, respectively. The TDVs 454 and 456 may be part of the PHI tile 150 or may be located externally to the PHI tile 150. The TDVs 454 and 456 receive the supply voltages VDD1 and VDD2 from external I/O pads of the FPGA or from voltage regulation logic on the FPGA (not shown). A line 499 demarcates the boundary between the FPGA and the PHI die.

Another input of the level-translation circuit 418 is configured to receive the supply voltage VDD2. Assume the FPGA (and hence the PHI tile 150) operates using the voltage supply VDD1, and the circuitry 452 of the PHI die 450 operates using the voltage supply VDD2. The level-translation circuit 418 is configured to translate the voltage of signals received from the register logic 414 from VDD1 to VDD2. This allows the signals provided by the register logic 414 to properly drive the circuitry 452.

In the present example, the TDVs 428 include N TDVs for providing N signals to the circuitry 452 in the PHI die 450. The TDVs 430 include M TDVs for receiving M signals from the circuitry 452 in the PHI die 450. The TDVs 430 are electrically and mechanically coupled to the backside of the die of the FPGA having the PHI tile 150. An input of the level-translation circuit 420 is electrically coupled to the TDVs 430. An output of the level translation circuit 420 is coupled to an input of the three-state buffer 412 through the test logic 422.

Another input of the level-translation circuit 420 is configured to receive the supply voltage VDD1. The level-translation circuit 420 is configured to translate the voltage of signals received from the circuitry 452 in the PHI die 450 from VDD2 to VDD1. This allows the signals provided by the PHI die 450 to properly drive circuitry in the FPGA that uses the VDD1 supply voltage.

Figure 5:
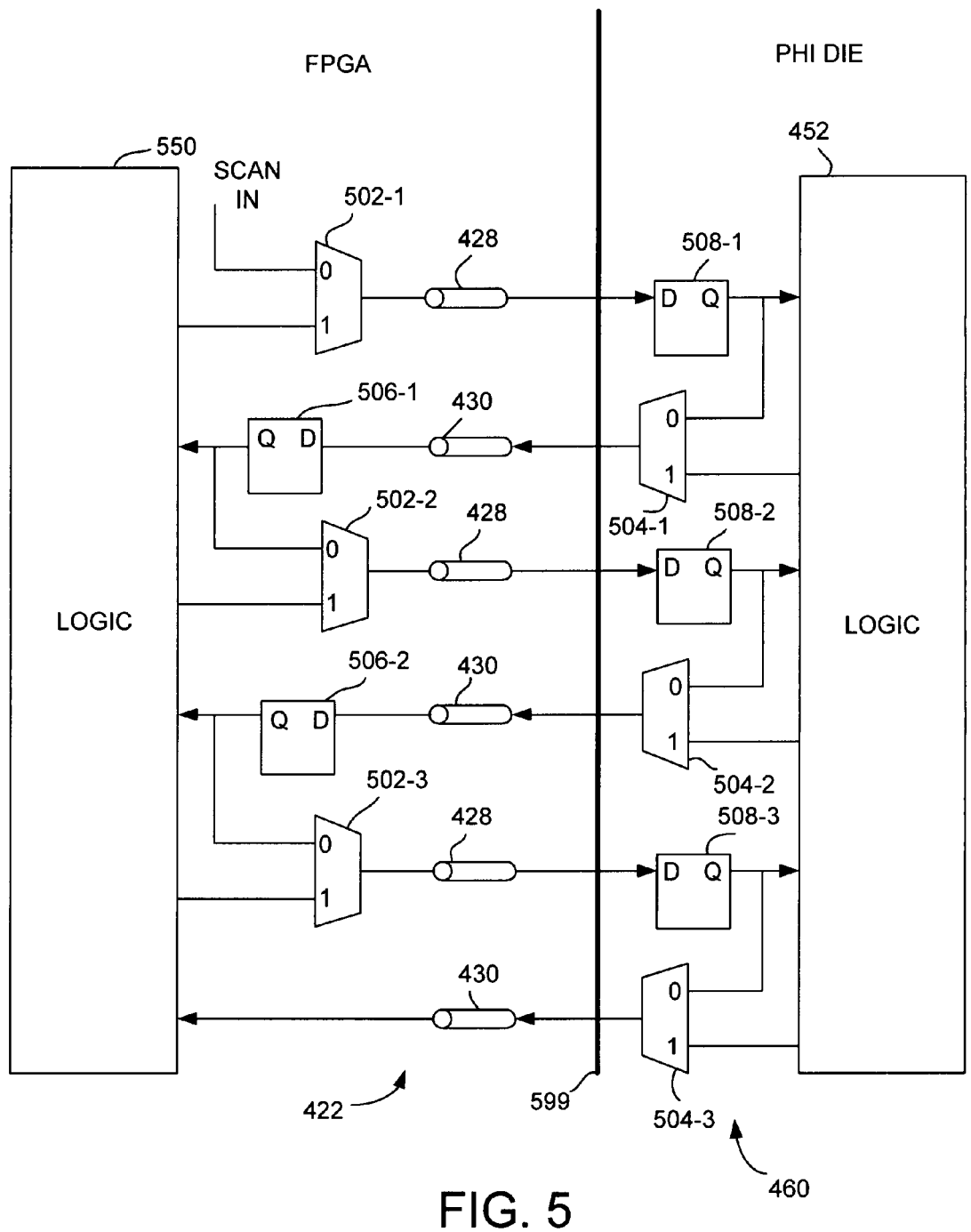
FIG. 5 is a block diagram depicting an exemplary embodiment of test circuitry in an interface tile in accordance with one or more aspects of the invention.

In one embodiment, the test circuitry 422 cooperates with test circuitry 460 on the PHI die 450 to provide a scan chain. Alternatively, the test circuitry 422 may include all circuits for providing the scan chain. Notably, FIG. 5 is a block diagram depicting an exemplary embodiment of the test circuitry 422 in accordance with one or more aspects of the invention. A line 599 demarcates the boundary between the FPGA and the PHI die. In the present example, logic 550 in the FPGA is coupled to the circuitry 452 of the PHI die 450 through the PHI tile 150. Elements of the PHI tile 150 other than the test circuitry 422 have been omitted for clarity.

The test circuitry 422 includes a plurality of multiplexers 502 and a plurality of flip-flops 506. Multiplexers 502-1 through 502-3, and flip-flops 506-1 and 506-2, are shown by example. The test circuitry 460 on the PHI die 450 also includes a plurality of multiplexers 504 and a plurality of flip-flops 508. Multiplexers 504-1 through 504-3, and flip-flops 508-1 through 508-3, are shown by example. One input of each of the multiplexers 502 is configured to receive one of the signals provided by the logic 550 (i.e., one of the N signals provided as input by the PHI tile 150). These inputs are selected if the multiplexers 502 receive a logic '1' control signal. An output of each of the multiplexers 502 is electrically coupled to one of the TDVs 428. In addition, an input of each of the flip-flops 508 (designated as "D") is electrically coupled to one of the TDVs 428. An output of each of the flip-flops 508 (designated as "Q") is coupled to the circuitry 452. The output of each of the flip-flops 508 is also coupled to another input of one of the multiplexers 504. These inputs are selected if the multiplexers 504 receive a logic '0' control signal.

Likewise, one input of each of the multiplexers 504 is configured to receive a signal produced by the circuitry 452 on the PHI die 450. These inputs are selected if the multiplexers 504 receive a logic '1' control signal. An output of each of the multiplexers 504 is electrically coupled to one of the TDVs 430. In addition, an input of each of the flip-flops 506 is electrically coupled to one of the TDVs 430. Outputs of the flip-flops 506 are coupled to the logic 550. The output of each of the flip-flops 506 is also coupled to another input of one of the multiplexers 502. These inputs are selected if the multiplexers 502 receive a logic '0' control signal.

In normal mode, the multiplexers 502 are controlled to pass signals from the logic 550 to the circuitry 452 on the PHI die 450 through the TDVs 428. Likewise, the multiplexers 504 are controlled to pass the signals from the circuitry 452 to the logic 550 through the TDVs 430. In normal mode, the multiplexers 502 and 504 are driven by a logic '1' control signal.

During the normal mode, the flip-flops 508 capture output state of the logic 550 and the flip-flops 506 capture output state of the circuitry 452.

In a test mode, the multiplexers 502 and 504 are driven by a logic '0' control signal. The multiplexers 502 are controlled to pass signals from the flip-flops 506, with the exception of the multiplexer 502-1, which selects a scan-in input. The scan-in input may provide a logic '0' or logic '1' input, or may receive input from test logic of another PHI tile in the FPGA. The multiplexers 504 are controlled to pass signals provided by the flip-flops 508. In this manner, the flip-flops 506 and 508 form a serial chain of flip-flops through which data may be shifted. The shifted out data is received by the logic 550 as a serial stream of bits. Thus, the state of the data input to the PHI die 450 and the data output by the PHI die 450 can be captured by the test circuitry 422 and 460.

In another embodiment, the multiplexers 504 and/or the flip-flops 508 are part of the test logic 422. In essence, all or a portion of the test logic 460 may be moved across the boundary 599. This reduces or eliminates special test logic in the PHI die 450.

Figure 6:
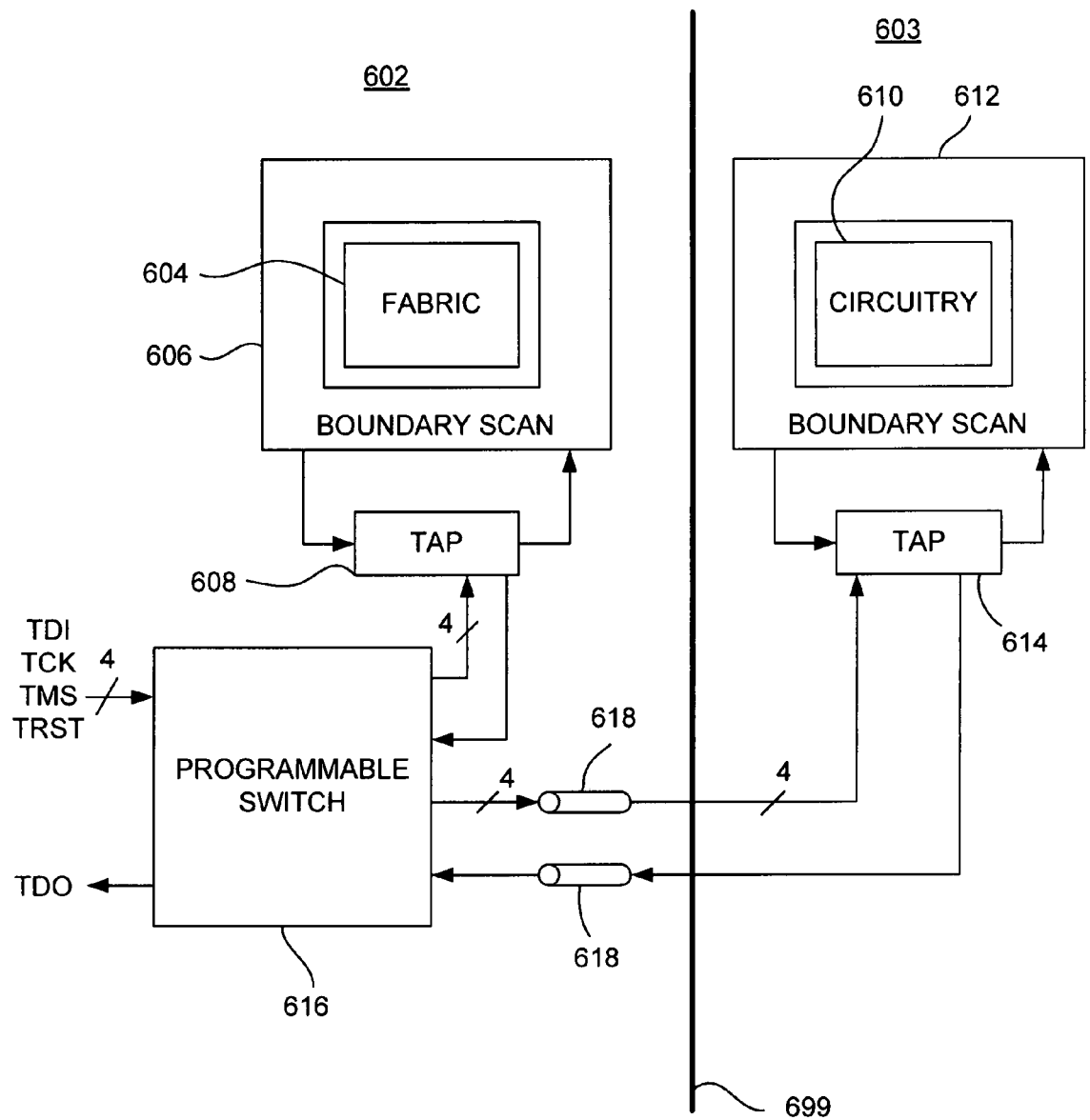
FIG. 6 is a block diagram depicting an exemplary embodiment of a system for testing a stacked IC in accordance with one or more aspects of the invention.

FIG. 6 is a block diagram depicting an exemplary embodiment of a system 600 for testing a stacked IC in accordance with one or more aspects of the invention. The system 600 includes an FPGA die 602 and a PHI die 603. A line 699 demarcates a boundary between the FPGA die 602 and the PHI die 603. Similar to the embodiments described above, the PHI die 603 is electrically and mechanically mounted to the backside of the FPGA die 602. The PHI die 603 is configured to communicate with the FPGA die 602 using TDVs in the FPGA die 602. In the present example, the FPGA die 602 includes fabric 604 and boundary scan logic 606. The fabric 604 comprises programmable logic and routing (e.g., the architecture shown in FIG. 1). The boundary scan logic 606 includes well-known logic for testing the fabric 604. Briefly stated, the boundary scan logic 606 includes a shift register cell for each signal pin of the FPGA die 602. The shift registers are connected in a dedicated path around the boundary of the fabric 604.

The boundary scan logic 606 is accessible via a test access port (TAP) 608. In one embodiment, the boundary scan logic 606 is compliant with the IEEE 1149.1 boundary scan architecture, known in the art as JTAG (Joint Test Action Group). The test access port 608 is configured to receive four input signals and is configured to provide one output signal. The four input signals are known in the art as the test data input (TDI), test clock (TCK), test mode select (TMS), and test reset (TRST). The output signal is known in the art as test data output (TDO). Control of the boundary scan logic 606 using the TDI, TCK, TMS, TRST, and TDO signals is well known in the art.

The PHI die 603 includes circuitry 610 and boundary scan logic 612. The boundary scan logic 612 is accessible via a test access port 614. The boundary scan logic 612 and the test access port 614 operate similarly to the boundary scan logic 606 and test access port 608 on the FPGA die 602. The FPGA die 602 further includes a programmable switch 616. The programmable switch 616 is configured to receive the TDI, TCK, TMS, and TRST signals for external to the die 602. The programmable switch 616 is coupled to the test access port 608 and the test access port 614. The programmable switch 616 is coupled to the test access port 614 through TDVs 618 in the FPGA die 602. The programmable switch 616 can be programmed to provide the TDI, TCK, TMS, and TRST input signals to either the test access port 608 or the test access port 614. In turn, the programmable switch 616 receives a TDO signal from either the test access port 608 or the test access port 614.

In this manner, either the FPGA die 602 or the PHI die 603 can be tested via JTAG by controlling the programmable switch 616. For purposes of clarity by example, only a single PHI die 603 is shown. Those skilled in the art will appreciate that the system 600 may be adapted to test more than one PHI die that is stacked on the FPGA die 602. To test additional PHI die, the FPGA die 602 is configured with additional TDVs coupled to the test pins of the additional PHI die, and the programmable switch 616 is capable of switching among all of the PHI die.

Figure 7:
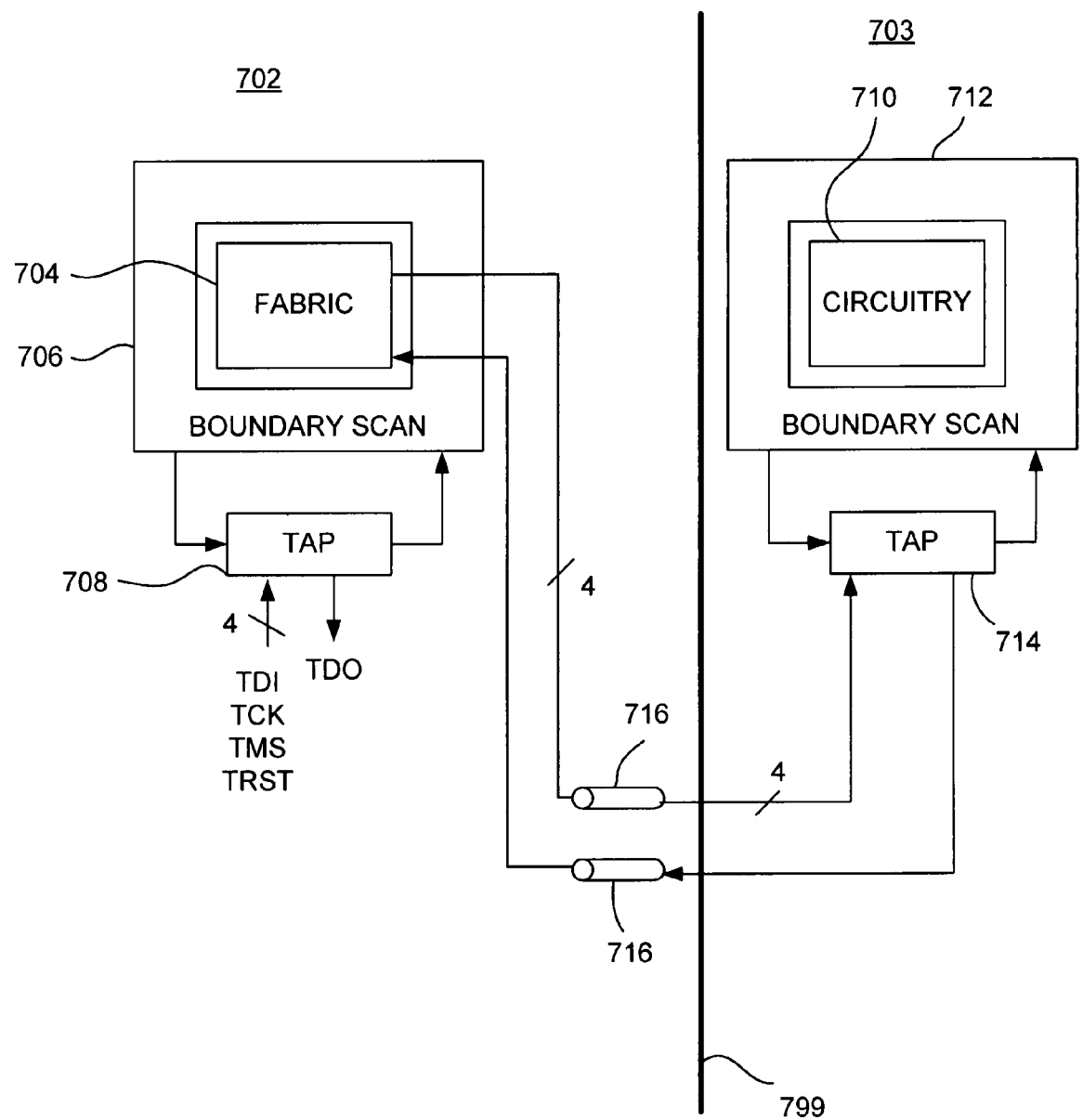
FIG. 7 is a block diagram depicting another exemplary embodiment of a system for testing a stacked IC in accordance with one or more aspects of the invention.

FIG. 7 is a block diagram depicting another exemplary embodiment of a system 700 for testing a stacked IC in accordance with one or more aspects of the invention. The system 700 includes an FPGA die 702 and a PHI die 703. A line 799 demarcates the boundary between the FPGA die 702 and the PHI die 703. Similar to the embodiments described above, the PHI die 703 is electrically and mechanically mounted to the backside of the FPGA die 702. The PHI die 703 is configured to communicate with the FPGA die 702 using TDVs in the FPGA die 702. In the present example, the FPGA die 702 includes fabric 704 and boundary scan logic 706. The fabric 704 comprises programmable logic and routing (e.g., the architecture shown in FIG. 1). The boundary scan logic 706 includes well-known logic for testing the fabric 704. The boundary scan logic 706 is accessible via a test access port 708. In the present example, the boundary scan logic 706 is compliant with the JTAG standard and thus is controlled using the TDI, TCK, TMS, TRST, and TDO signals, as described above. These signals are coupled directly to and received directly from the test access port 708.

The PHI die 703 includes circuitry 710 and boundary scan logic 712. The boundary scan logic 712 is accessible via a test access port 714. The boundary scan logic 712 and the test access port 714 operate similarly to the boundary scan logic 706 and test access port 708 on the FPGA die 702. The FPGA die 702 further includes TDVs 716 coupled to the test access port 714. The TDVs 716 are also coupled to the fabric 704 of the FPGA die 702. The fabric 704 is configured to generate the required test patterns to perform functional testing of the PHI die 703. That is, the fabric 704 drives the test access port 714 with the TDI, TCK, TMS, and TRST signals through the TDVs 716. The fabric 704 receives the TDO signal from the test access port 714 through the TDVs 716.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit die having an array of tiles arranged in columns, comprising:
    at least one interface tile, each interface tile comprising:
        a logic element coupled to a routing fabric of the integrated circuit die;
        contacts configured to be coupled to conductive interconnect of another integrated circuit die attached to a backside of the integrated circuit die; and
        through die vias (TDVs) configured to couple the logic element to the contacts.

2. The integrated circuit die of claim 1, wherein the logic element comprises:

at least one programmable interconnect switch coupled to the routing fabric;
a configurable logic element;
a first interface circuit coupled to a first plurality of the TDVs;
a second interface circuit coupled to a second plurality of the TDVs; and
selection logic for selectively coupling first signals from the at least one programmable interconnect switch to either the configurable logic element or the first interface circuit, and second signals to the at least one programmable interconnect switch from either the configurable logic element or the second interface circuit.

3. The integrated circuit die of claim 2, wherein the selection logic comprises three-state buffers.

4. The integrated circuit die of claim 2, wherein the first interface circuit includes first register logic configured to buffer the first signals, and wherein the second interface circuit includes second register logic configured to buffer the second signals.

5. The integrated circuit die of claim 2, wherein the first interface circuit includes a first level-translation circuit for translating voltage of the first signals from a first supply voltage to a second supply voltage, and wherein the second interface circuit includes a second level-translation circuit for translating voltage of the second signals from the second supply voltage to the first supply voltage.

6. The integrated circuit die of claim 2, wherein the first interface circuit and the second interface circuit include test logic for capturing state of the first signals and the second signals.

7. The integrated circuit die of claim 6, wherein the test logic comprises multiplexers and flip-flops and is configured to cooperate with additional test logic in the other integrated circuit die to implement a scan chain.

8. A semiconductor device, comprising:
a first integrated circuit die; and
a second integrated circuit die attached to the backside of the first integrated circuit die;
wherein the first integrated circuit die includes an array of tiles arranged in columns and providing a routing fabric, the tiles including at least one interface tile, each interface tile comprising:
  a logic element coupled to the routing fabric;
  contacts formed on the backside of the first integrated circuit die and coupled to conductive interconnect of the second integrated circuit die; and
  through die vias (TDVs) configured to couple the logic element to the contacts.

9. The semiconductor device of claim 8, wherein the logic element comprises:
at least one programmable interconnect switch coupled to the routing fabric;
a configurable logic element;
a first interface circuit coupled to a first plurality of the TDVs;
a second interface circuit coupled to a second plurality of the TDVs; and
selection logic for selectively coupling first signals from the at least one programmable interconnect switch to either the configurable logic element or the first interface circuit, and second signals to the at least one programmable interconnect switch from either the configurable logic element or the second interface circuit.

10. The semiconductor device of claim 9, wherein the selection logic comprises three-state buffers.

11. The semiconductor device of claim 9, wherein the first interface circuit includes first register logic configured to buffer the first signals, and wherein the second interface circuit includes second register logic configured to buffer the second signals.

12. The semiconductor device of claim 9, wherein the first interface circuit includes a first level-translation circuit for translating voltage of the first signals from a first supply voltage to a second supply voltage, and wherein the second interface circuit includes a second level-translation circuit for translating voltage of the second signals from the second supply voltage to the first supply voltage.

13. The semiconductor device of claim 9, wherein the first interface circuit and the second interface circuit include test logic for capturing state of the first signals and the second signals.

14. The semiconductor device of claim 13, wherein the test logic comprises multiplexers and flip-flops and is configured to cooperate with additional test logic in the other integrated circuit die to implement a scan chain.

15. A semiconductor device, comprising:
a first integrated circuit die having first circuitry, first boundary scan logic, and a first test access port, the first test access port coupled to the first boundary scan logic;
a second integrated circuit die attached to the backside of the first integrated circuit die, the second integrated circuit die having second circuitry, second boundary scan logic, and a second test access port, the second test access port coupled to the second boundary scan logic; and
through-die vias (TDVs) formed on the first integrated circuit die electrically coupled to the second test access port, wherein an input test signal is enabled to be provided to either the first test access port or first ones of the TDVs and an output test signal is enabled to be received from either the first test access port or a second one of the TDVs.

16. The semiconductor device of claim 15, wherein the first boundary scan logic and the second boundary scan logic each comprise joint test action group (JTAG) logic, wherein the input test signal comprises a plurality of: a test data input (TDI) signal, a test clock (TCK) signal, a test mode select (TMS) signal, or a test reset (TRST) signal, and wherein the output test signal comprises a test data output (TDO) signal.

17. The semiconductor device of claim 15, wherein the first integrated circuit die comprises a field programmable gate array (FPGA).

18. The semiconductor device of claim 15, further comprising a programmable switch formed on the first integrated circuit die configured to selectively provide the input test signal to either the first test access port or first ones of the TDVs and receive an output test signal from either the first test access port or a second one of the TDVs.

* * * * *